US007841787B2

(12) United States Patent
Takeguchi et al.

(10) Patent No.: US 7,841,787 B2
(45) Date of Patent: Nov. 30, 2010

(54) RINSING METHOD, DEVELOPING METHOD, DEVELOPING SYSTEM AND COMPUTER-READ STORAGE MEDIUM

(75) Inventors: Hirofumi Takeguchi, Koshi (JP); Junji Nakamura, Koshi (JP); Kousuke Yoshihara, Koshi (JP)

(73) Assignee: Tokyo Electron Limited, Tokyo-To (JP)

( * ) Notice: Subject to any disclaimer, the term of this patent is extended or adjusted under 35 U.S.C. 154(b) by 1055 days.

(21) Appl. No.: 11/554,192

(22) Filed: Oct. 30, 2006

(65) Prior Publication Data
US 2007/0116459 A1    May 24, 2007

(30) Foreign Application Priority Data
Nov. 10, 2005    (JP) .............................. 2005-326508

(51) Int. Cl.
  G03D 5/00    (2006.01)
  G03C 1/00    (2006.01)
  G03C 5/18    (2006.01)
  G03C 5/26    (2006.01)
  B08B 7/00    (2006.01)
  B05D 3/12    (2006.01)

(52) U.S. Cl. ....................... 396/604; 396/611; 430/432; 430/434; 134/33; 427/240

(58) Field of Classification Search ................... 396/604
See application file for complete search history.

(56) References Cited

U.S. PATENT DOCUMENTS 6,382,849 B1 *  5/2002  Sakamoto et al. ........... 396/611

2007/0267047 A1 * 11/2007 Hori et al. ..................... 134/33
2008/0078426 A1 *  4/2008 Miya et al. .................... 134/30
2008/0090185 A1 *  4/2008 Harumoto et al. ........... 430/432
2008/0090186 A1 *  4/2008 Harumoto et al. ........... 430/434

FOREIGN PATENT DOCUMENTS

| JP | 07-135136 | 5/1995 |
| JP | 2001-57334 | 2/2001 |
| JP | 2003-007595 | 1/2003 |

OTHER PUBLICATIONS

Office Action issued Jul. 12, 2010, in Japanese Application No. 2005-326508, 9 pages, (with English translation).

* cited by examiner

Primary Examiner—Clayton E LaBalle
Assistant Examiner—Bret Adams
(74) Attorney, Agent, or Firm—Oblon, Spivak, McClelland, Maier & Neustadt, L.L.P.

(57) ABSTRACT

The present invention provides a rinsing method capable of satisfactorily rinsing the surface of a resist film regardless of the condition of the surface of the resist film so that development defects caused by residuals produced by development may be reduced. A rinsing method of rinsing a substrate processed by a developing process for developing an exposed pattern comprises the steps of discharging a rinsing liquid onto a central part of the substrate processed by the developing process and coated with a developer puddle while the substrate is stopped or rotated (step 5), stopping discharging the rinsing liquid in a state where the developer puddle remains at least in a peripheral part of the substrate (step 6), and rotating the substrate at a high rotating speed to shake the developer remaining on the substrate off the substrate together with the rinsing liquid (step 7).

16 Claims, 12 Drawing Sheets

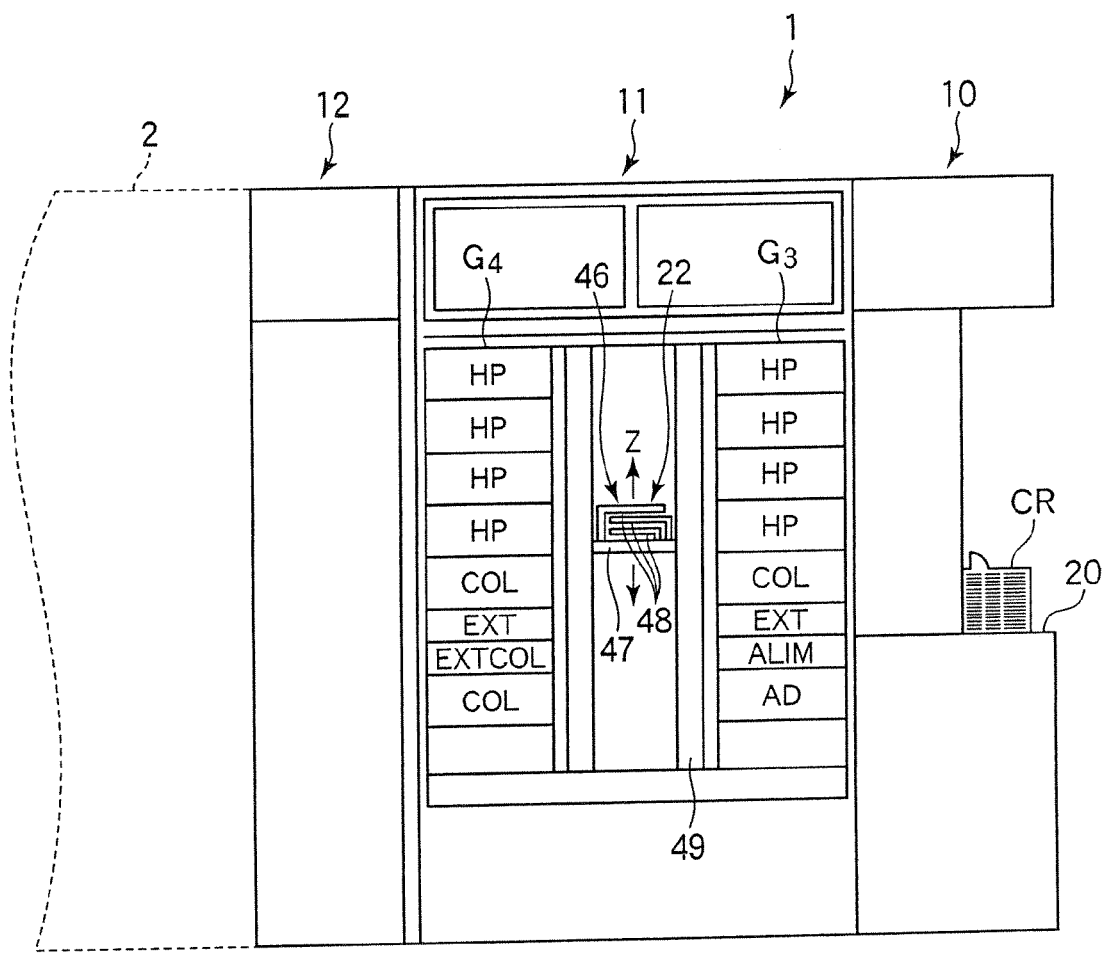
F I G. 3

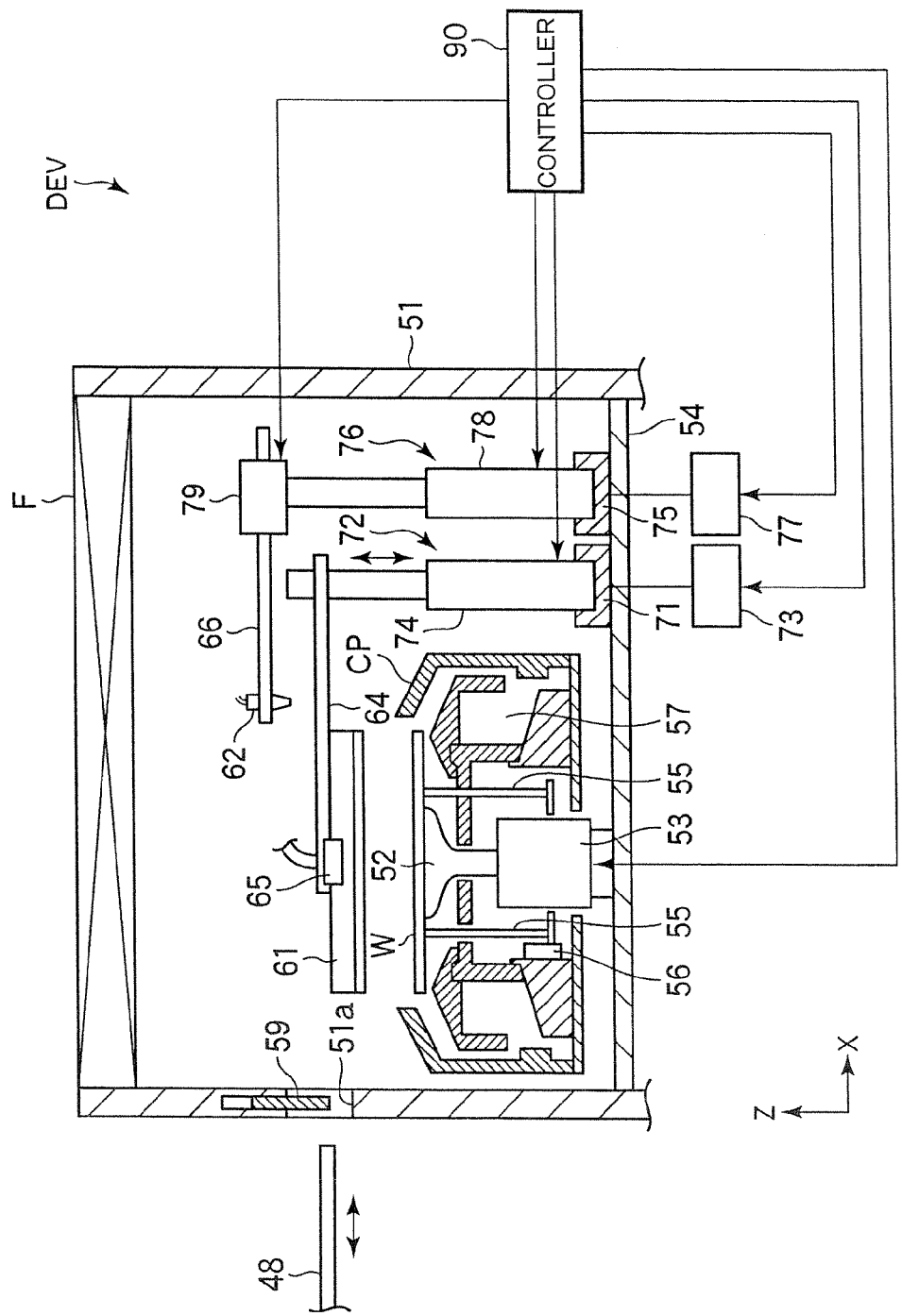
F I G. 4

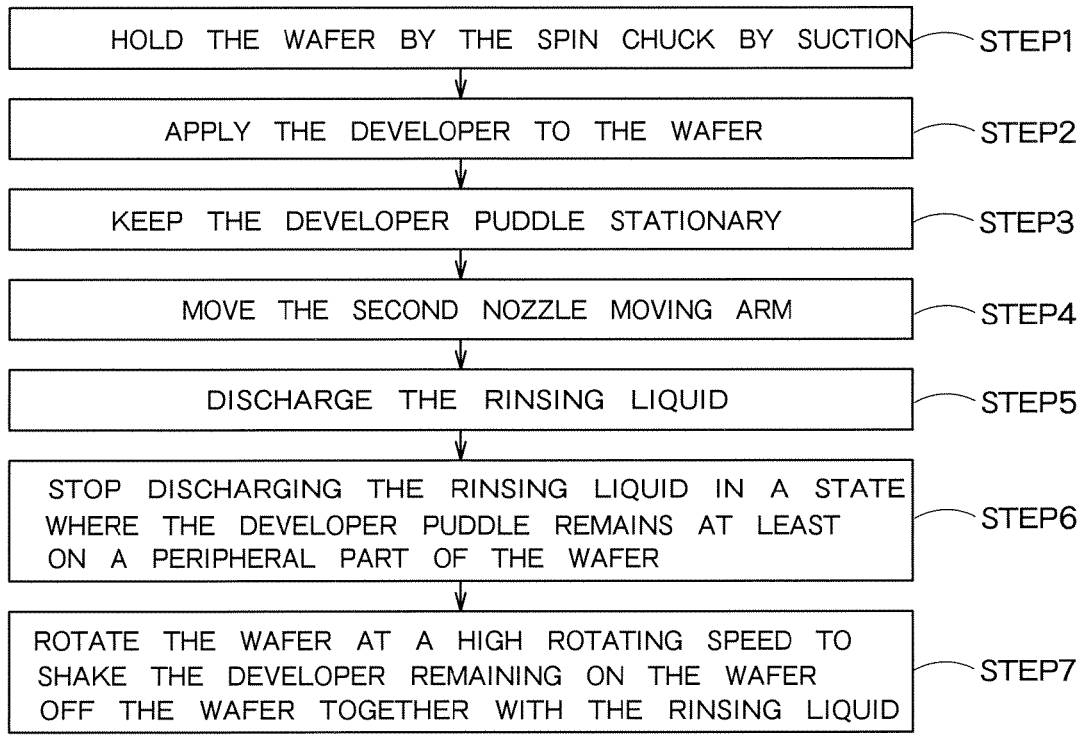
F I G. 7

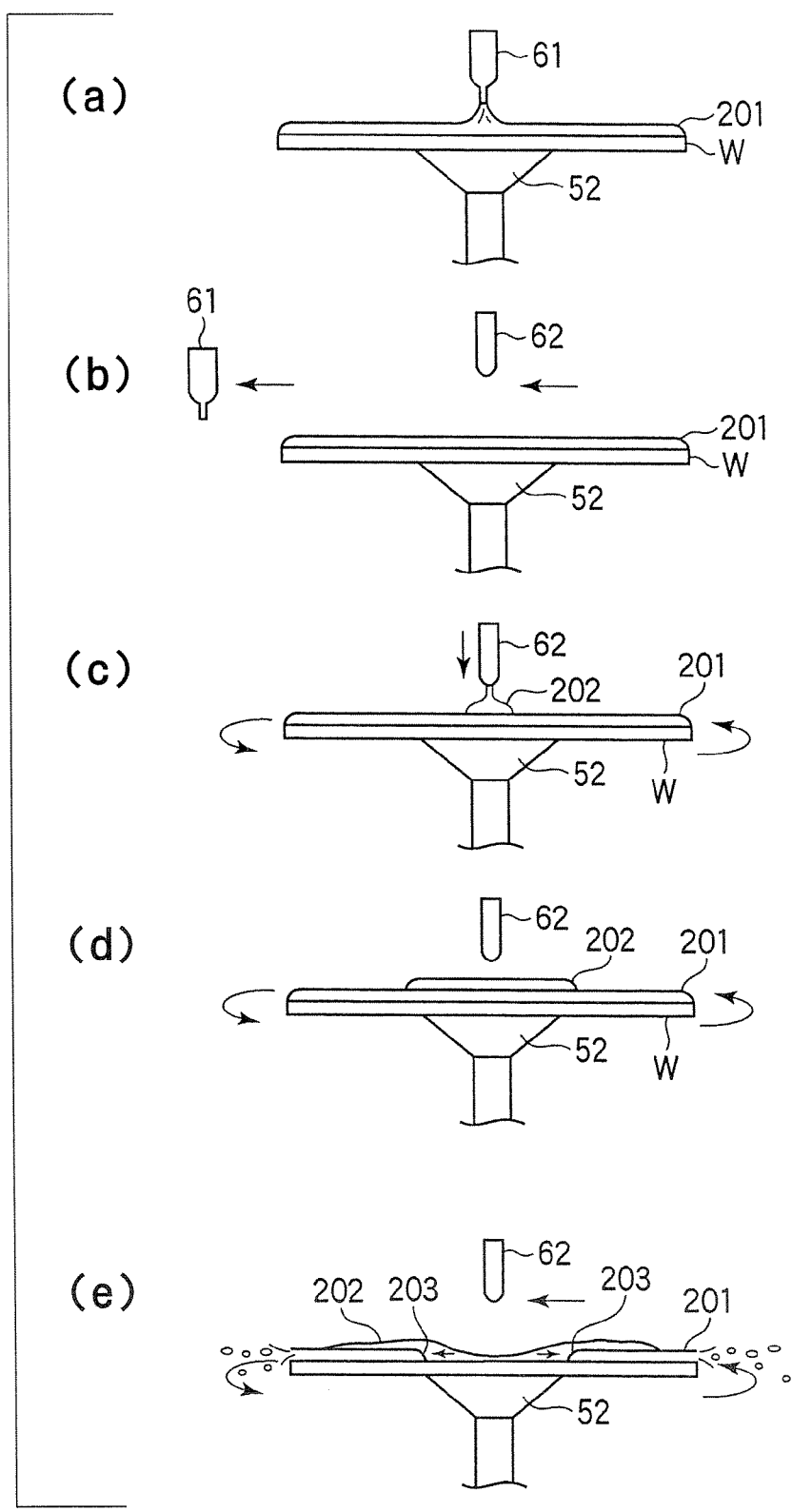
F I G. 8

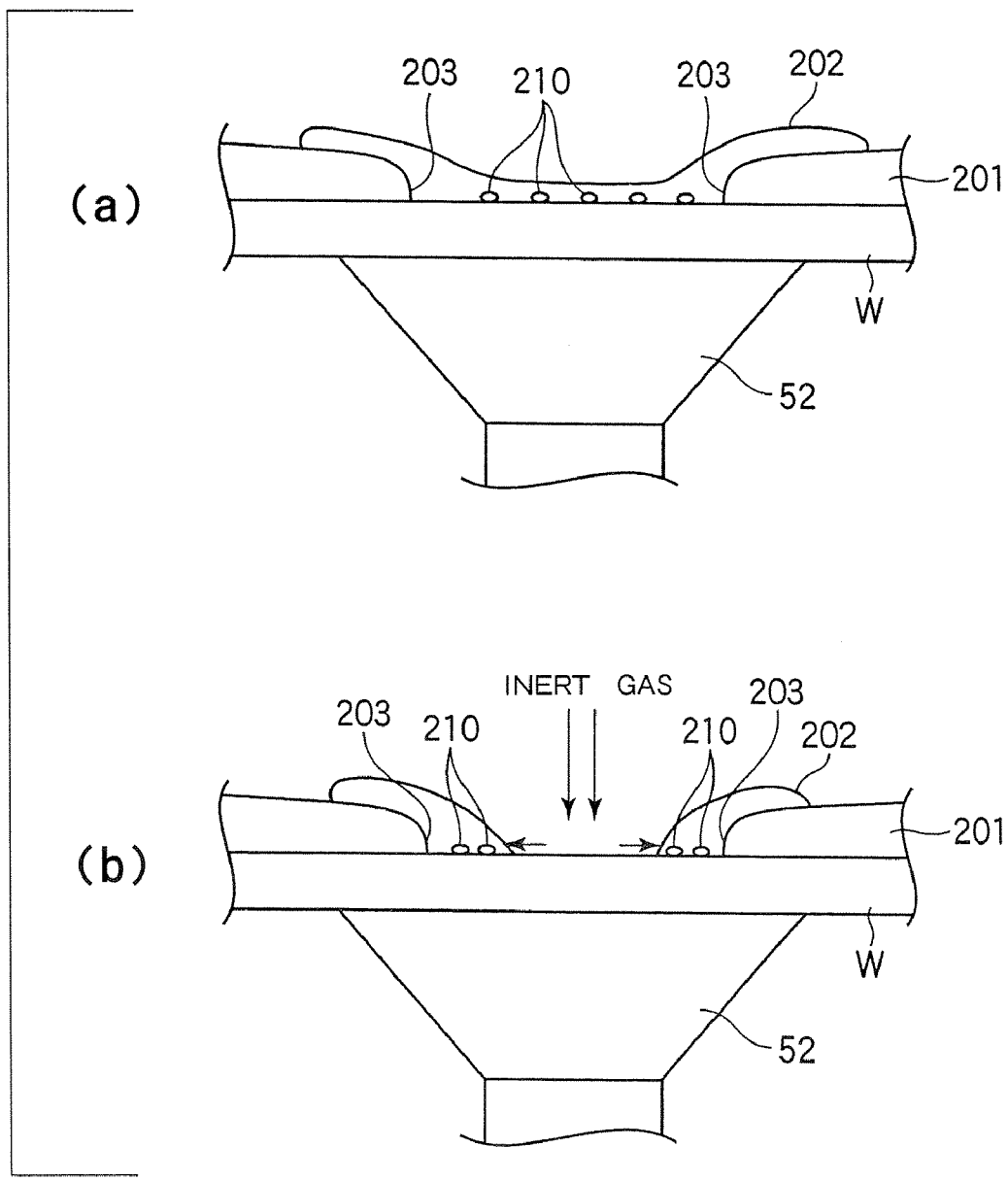
F I G. 12

(a) 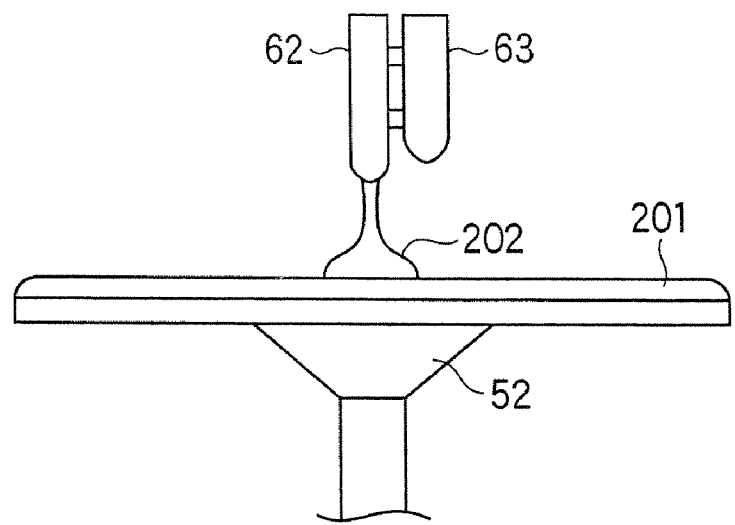
(b) 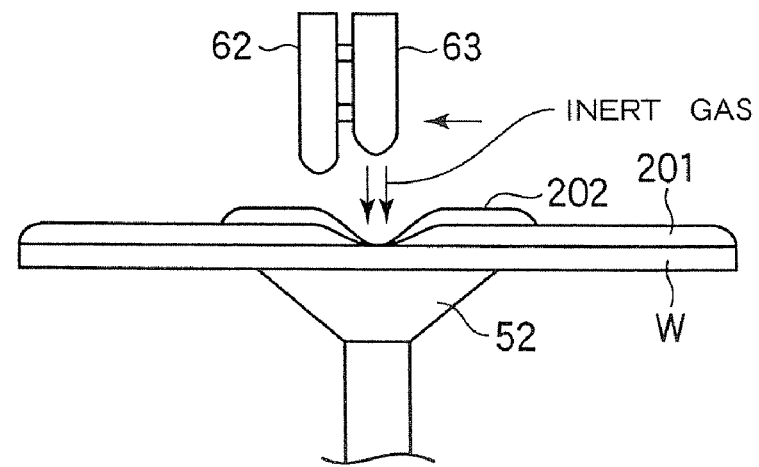
F I G. 13

(a) 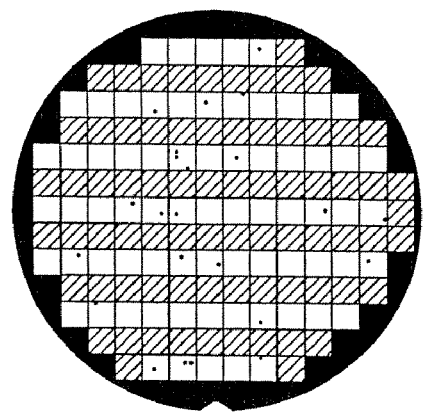
(b) 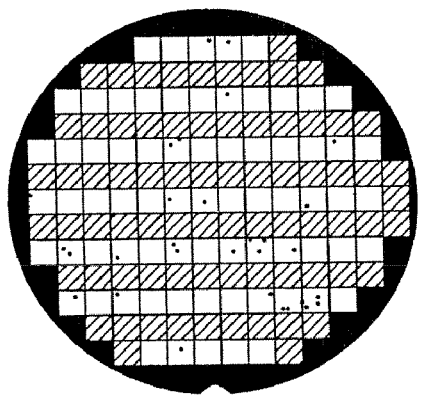
(c) 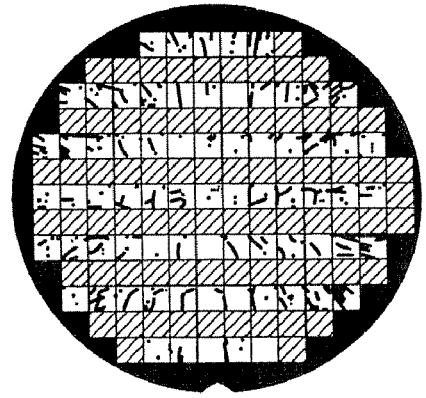
F I G. 14

RINSING METHOD, DEVELOPING METHOD, DEVELOPING SYSTEM AND COMPUTER-READ STORAGE MEDIUM

BACKGROUND OF THE INVENTION

1. Field of the Invention

The present invention relates to a rinsing method of rinsing a substrate, such as a semiconductor wafer, carrying thereon an exposed pattern processed by a developing process by a rinsing process, a developing method including such a rinsing process, a developing system capable of carrying out the developing method, and a computer-read storage medium storing control programs for controlling those methods.

2. Description of the Related Art

In a semiconductor device fabricating process, for example, a resist pattern as a mask for forming a predetermined pattern is formed on a surface of a semiconductor wafer (hereinafter referred to simply as "wafer") by a photolithographic method including the steps of forming a resist film on the surface of the wafer by discharging a liquid resist onto the surface of the wafer, processing the resist film formed on the surface of the wafer by an exposure process to form a predetermined pattern in the resist film and developing the exposed pattern.

The developing process among those steps of the photolithographic method discharges a developer onto the wafer to form a developer puddle of the developer over the entire surface of the wafer, lets the developer circulate by natural convection to make the developing process progress, discharges a rinsing liquid, such as pure water, onto a central part of the wafer while the wafer is being rotated to rinse out the developer remaining on the wafer from the wafer, and rotates the wafer at a high rotating speed to dry the wafer by shaking the developer and the rinsing liquid off the wafer. Such a developing process is disclosed in, for example, JP-A 2001-057334 (Patent document 1).

The reduction of the thickness of lines forming circuit patterns, the miniaturization of circuit patterns and the increase of the number of components of semiconductor devices have made a rapid progress in recent years. Consequently, further improvement of exposure resolution has been desired. Studies have been made to develop exposure techniques using short-wavelength laser beams emitted by argon fluoride lasers (ArF lasers), krypton fluoride lasers (KrF lasers) and the like and immersion exposure techniques that fill up a space between a lens and a wafer with a liquid, such as pure water, and irradiates the wafer with light transmitted by the liquid filling up the space Resists used by exposure techniques using ArF and KrF lasers and immersion exposure techniques have properties different from known resists and have a high hydrophobic property and it is difficult for the rinsing step of the conventional developing process to remove satisfactorily residuals remaining on the wafer after development, such as matters produced by dissolution. Unremoved residuals are converted into particles adhering to the wafer and those particles cause development defects.

SUMMARY OF THE INVENTION

The present invention has been made in view of such circumstances and it is therefore an object of the present invention to provide a rinsing method capable of reducing development defects caused by residuals produced by development regardless of the property of the surface of a resist film, a developing method including a rinsing step for carrying out the rinsing method, and a developing system. Another object of the present invention is to provide a computer-read storage device storing a control program for controlling those methods.

According to a first aspect of the present invention, a rinsing method of rinsing a substrate processed by a developing process that forms a developer puddle on a resist film formed on the substrate and having an exposed pattern includes the steps of: discharging a rinsing liquid onto a central part of the substrate processed by the developing process and coated with the developer puddle while the substrate is stopped or rotated; stopping discharging the rinsing liquid in a state where the developer puddle remains at leased in a peripheral part of the substrate; and rotating the substrate at a high rotating speed to shake the developer remaining on the substrate off the substrate together with the rinsing liquid.

According to a second aspect of the present invention, a developing method of developing an exposed pattern formed in a resist film formed on a substrate includes the steps of: forming a developer puddle over an exposed resist film formed on a substrate by applying the developer to the resist film; making development progress by keeping the developer puddle still; discharging a rinsing liquid onto a central part of the substrate while the substrate coated with the developer puddle is stopped or rotated; stopping discharging the rinsing liquid in a state where the developer puddle remains at least in a peripheral part of the substrate; and shaking off the developer remaining on the substrate together with the rinsing liquid by rotating the substrate at a high rotating speed.

According to the first and the second aspect of the present invention, the discharge of the rinsing liquid may be stopped before the rinsing liquid spreading from the central part of the substrate reaches the edge of the substrate. Preferably, the discharge of the rinsing liquid is stopped upon the spread of the rinsing liquid in a circular area of a radius between 30 and 130 mm about the center of the substrate. Typically, the discharge of the rinsing liquid is stopped upon the spread of the rising liquid in a circular area of a radius of 50 mm about the center of the substrate. The rinsing liquid discharged onto the substrate while the substrate is rotating shoves the developer puddle radially outward. The discharge of the rinsing liquid may be stopped before a boundary plane between the rinsing liquid and the developer puddle reaches the outer edge of the substrate. Preferably, the substrate is rotated at a rotating speed between 500 and 2000 rpm for a short time immediately before the discharge of the rinsing liquid is stopped. Preferably, the discharge of the rinsing liquid is stopped upon the expansion of a boundary plane between the rinsing liquid and the developer puddle to a position at a distance between 30 and 130 mm from the center of the substrate. Typically, the discharge of the rinsing liquid is stopped upon the expansion of the boundary lane between the rinsing liquid and the developer puddle to a position at 50 mm from the center of the substrate.

According to the first and the second aspect of the present invention, it is preferable that the rinsing liquid is discharged at a discharging rate of 500 ml/minor below. The substrate is rotated at a rotating speed of 500 rpm or below, preferably, at 100 rpm or below, at the initial stage of discharging the rinsing liquid. Preferably, the rotating speed of the substrate is increased immediately before stopping the discharge of the rinsing liquid. Preferably, an inert gas is blown against a central part of the substrate immediately before stopping the discharge of the rinsing liquid. Preferably, an inert gas is blown against a central part of the substrate immediately before shaking the developer off the substrate together with the rinsing liquid. Preferably, the substrate is rotated at a rotating speed of 1000 rpm or above in the step of shaking the developer off the substrate together with the rinsing liquid.

These methods are suitable for a state where contact angle between the surface of the wafer processed by the developing process and the rinsing liquid is between 20° and 50°.

According to a third aspect of the present invention, a developing system for developing an exposed pattern formed in a resist film formed on a substrate includes: a substrate holding unit for horizontally holding a substrate; a rotating mechanism for rotating the substrate holding unit; a developer discharge nozzle for discharging a developer onto the substrate held by the substrate holding unit; a rinsing liquid discharge nozzle for discharging a rinsing liquid onto the substrate held by the substrate holding unit; a nozzle moving mechanism for moving the developer discharge nozzle and the rinsing liquid discharge nozzle; and a control unit for controlling the rotating mechanism, the nozzle moving mechanism, discharging the developer through the developer discharge nozzle and discharging the rinsing liquid through the rinsing liquid discharge nozzle; wherein the control unit controls the rotating mechanism, the nozzle moving mechanism, discharging the developer through the developer discharge nozzle and discharging the rinsing liquid through the rinsing liquid discharge nozzle to carry out the steps of forming a developer puddle over the exposed resist film formed on the substrate by applying the developer to the resist film, making development progress by keeping the developer puddle still, discharging a rinsing liquid onto a central part of the substrate while the substrate coated with the developer puddle is stopped or rotated, stopping discharging the rinsing liquid in a state where the developer puddle remains at least in a peripheral part of the substrate, and shaking the developer remaining on the substrate off the substrate together with the rinsing liquid by rotating the substrate at a high rotating speed.

According to a fourth aspect of the present invention, a computer-read storage medium storing a control program to be executed by a computer; wherein the computer executes the control program to control a developing system for carrying out the method according to the first or the second aspect of the present invention.

If the surface of the substrate is highly hydrophobic and the rinsing liquid is shook off after the developer has been completely rinsed out by the conventional method, the ringing liquid is unable to spread over the entire surface of the substrate, some peripheral parts of the surface of the substrate are not rinsed with the rinsing liquid and development defects are likely to be formed in the peripheral parts. According to the present invention, the rinsing liquid is discharged onto a central part of the substrate after the completion of development while the substrate coated with the developer is stopped or rotating, discharging the rinsing liquid is stopped in a state where the developer puddle is remaining at least in a peripheral part of the substrate, and then the substrate is rotated at a high rotating speed to shake the developer off the substrate together with the rinsing liquid. Consequently, the rinsing liquid discharged onto the substrate while the substrate is rotating shoves the developer puddle off the substrate. Thus the layer of the rinsing liquid will not be broken on the peripheral part of the substrate and residuals remaining after the developing process can be more surely removed. Thus development defects can be reduced regardless of the property of the surface of the substrate.

BRIEF DESCRIPTION OF THE DRAWINGS

FIG. 3 is a rear view of the resist film forming and developing system shown in FIG. 1;

FIG. 4 is a sectional view of a developing unit that carries out a method in a preferred embodiment according to the present invention;

FIG. 7 is a flow chart of a developing method including a rinsing method in a preferred embodiment according to the present invention;

FIG. 8 is a view of assistance in explaining steps of the developing method;

FIG. 12 is a view of assistance in explaining the effects of the rinsing methods in the second and the third embodiment;

FIG. 13 is a view of assistance in explaining a nozzle and its operation employed by the rinsing methods in the second and the third embodiment; and FIG. 14 is a wafer map showing development defects in wafers rinsed by a rinsing recipe of the rinsing method embodying the present invention and a rinsing recipe of a rinsing method in a comparative example.

DESCRIPTION OF THE PREFERRED EMBODIMENTS

Preferred embodiments of the present invention will be described with reference to the accompanying drawings.

Figure 1:
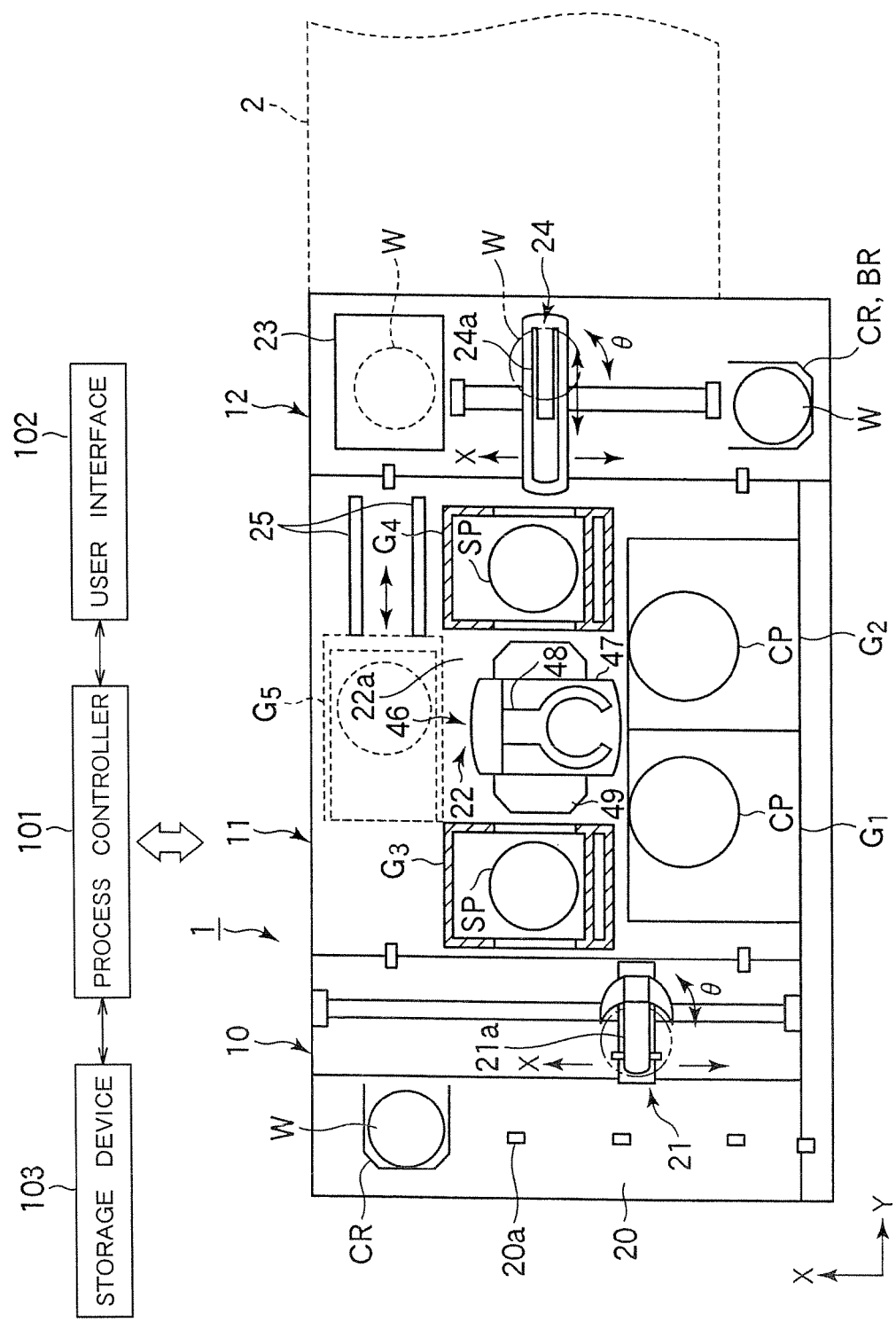
FIG. 1 is a schematic plan view of a resist film forming and developing system provided with a developing unit for carrying out methods according to the present invention.
Figure 2:
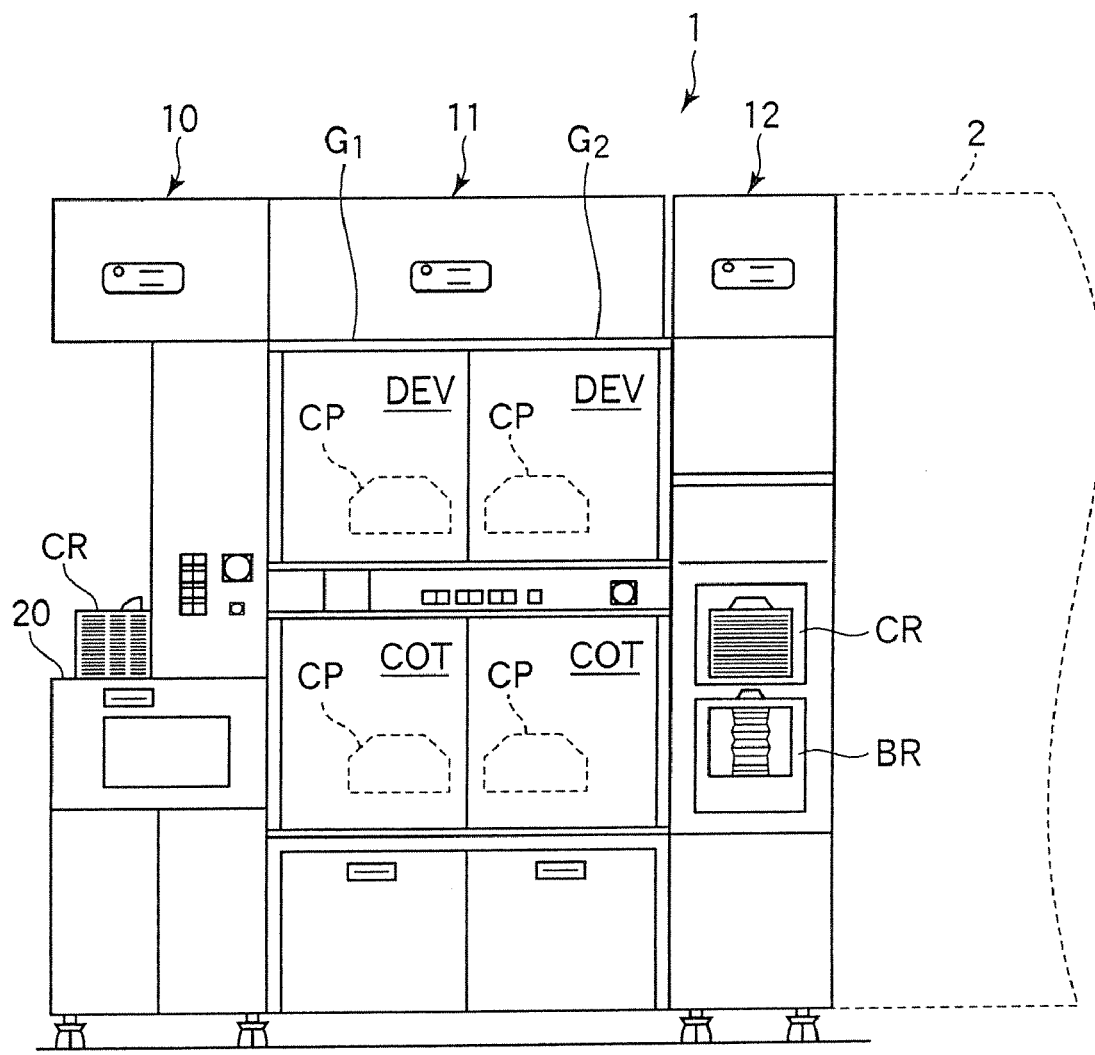
FIG. 2 is a front elevation of the resist film forming and developing system shown in FIG. 1.

FIGS. 1, 2 and 3 are a schematic plan view, a front elevation and a rear view, respectively, of a resist film forming and developing system 1 provided with a developing unit for carrying out methods according to the present invention.

The resist film forming and developing system 1 includes a cassette station 10, namely, a cassette handling station, a processing station 11 including a plurality of processing units, and an interface unit for transferring a wafer W between the processing station 11 and an exposure system 2 disposed near the processing system 11.

The cassette station 10 receives and sends out a wafer cassette CR containing a plurality of wafers W, namely, workpieces. Referring to FIG. 1, the cassette station 10 has a table 20 provided on its upper surface with four positioning protrusions 20a arranged in an X direction. Wafer cassettes CR can be placed o the table 20 at positions corresponding to the positioning protrusions 20a, respectively. A wafer carrying mechanism 21 is disposed in the cassette station 10 between the table 20 and the processing station 11. The wafer carrying mechanism 21 has a wafer carrying arm 21a capable of moving in X-directions in which the wafer cassettes CR are arranged and in Z-directions in which wafers W are arranged in the wafer cassette CR and of turning in θ-directions. The carrying arm 21a is capable of selectively accessing one of the wafer cassettes CR. The carrying arm 21 is capable of accessing the processing station 11.

The processing station 11 includes a plurality of processing units for carrying out a series of steps of a resist film forming and developing method. The plurality of processing units are stacked in layers at predetermined positions. Wafers W are processed one by one. Referring to FIG. 1, a main wafer carrying mechanism 22 is disposed in a central carrying zone 22a in the processing station 11. All the processing units are arranged around the carrying zone 22a. The processing units are divided into a plurality of processing unit groups. The processing units of each of the processing unit groups are stacked up vertically in layers.

Referring to FIG. 37 the main wafer carrying mechanism 22 has a wafer carrying device 46 placed in a tubular support structure 49. The wafer carrying device 46 can move vertically in the Z directions in the tubular support structure 49. The tubular support structure 49 can be turned together with the wafer carrying device 46 by a rotative force of a motor, not shown. The wafer carrying device 46 has a carrier base 47 and a plurality of holding members 48 supported for longitudinal movement on the carrier base 47. The holding members 48 hold a wafer W and transfer a wafer w to and receive the same from each of the processing units.

Referring to FIG. 1, four processing unit groups $G_1$, $G_2$, $G_3$ and $G_4$ are arranged around the carrying zone 22a. A processing unit group $G_5$ can be added when necessary.

The first processing unit group $G_1$ and the second processing unit group $G_2$ are arranged side by side in a front part, namely, a lower part as viewed in FIG. 1, of the resist film forming and developing system 1. The third processing unit group $G_3$ is adjacent to the cassette station 10. The fourth processing unit group $G_4$ is adjacent to the interface unit 12. The fifth processing unit group $G_5$ can be disposed in a back part of the resist film forming and developing system 1.

The first processing unit group $G_1$ includes a resist film forming unit COT for coating a wafer W mounted on a spin chuck, not shown, disposed inside a cup CP with a resist film and a developing unit DEV for developing a resist pattern on a wafer W placed in a cup CP, which are stacked up in that order in two layers. Similarly, the second processing unit group $G_2$ includes a resist film forming unit COT and a developing unit DEV, which are stacked up in that order in two layers.

As shown in FIG. 3, the third processing unit group $G_3$ includes oven type processing units for processing a wafer W supported on a wafer support SP by predetermined processes stacked up in layers. More concretely, the processing unit group $G_3$ includes an adhesion unit AD for carrying out a hydrophobicity imparting process to enhancing the adhesion of a resist film to a wafer W, an alignment unit ALIM, an extension unit EXT for receiving and sending out a wafer W, a cooling unit COL for carrying out a cooling process, and four hot plate units HP for processing a wafer W by a heating process before processing the wafer by an exposure process, and after processing the wafer W by a developing process, which are stacked up in that order in eight layers.

The fourth processing unit group $G_4$ includes oven type processing units stacked up in layers. More concretely, the processing unit group $G_4$ includes a cooling unit COL, an extension cooling unit EXTCOL provided with a cooling plate and capable of receiving and sending out a wafer W, an extension unit EXT, a cooling unit COL and four hot plate units HP, which are stacked up in that order in eight layers.

When the fifth processing group $G_5$ is disposed behind the main wafer carrying mechanism 22, the fifth processing unit group $G_5$ can move in transverse directions, as viewed from the main wafer carrying mechanism 22, along guide rails 25 to facilitate maintenance work.

Referring to FIGS. 1 and 2, a portable pickup cassette CR and a stationary buffer cassette BR are stacked in two layers in the interface unit 12. An edge exposure device 23 is disposed in a back part of the interface unit 12. A carrying mechanism 24 is disposed in a central part of the interface unit 12. The carrying mechanism 24 is provided with a wafer carrying arm 24a capable of moving in the X-directions and Z-directions and of turning in the θ-directions. The wafer carrying arm 24a can access the cassettes CR and BR, the edge exposure device 23, the extension unit EXT of the fourth processing unit group $G_4$ and a wafer transfer table, not shown, included in the adjacent exposure system 2.

The components including the units and the carrying mechanisms of the resist film forming and developing system 1 are connected to and controlled by a process controller 101 provided with a CPU. Connected to the process controller 101 are a user interface 102 including a keyboard to be operated by an operator in charge of process control to enter instructions for controlling the components of the resist film forming and developing system 1 and a display for visually displaying operating conditions of the components of the resist film forming and developing system 1, and a storage device 103 storing control programs to be carried out by the process controller 101 to control processes to be carried out by the resist film forming and developing system 1 and data on processing conditions.

When necessary, a desired recipe is read from the storage device 103 in response to an instruction given by the user interface 102 and the desired recipe is carried out by the process controller 101. Thus the resist film forming and developing system 1 carries out desired processes under the control of the process controller 101. Recipes may be stored in a read storage device, such as a CD-ROM, a hard disk, a flexible disk or a nonvolatile storage or may be received from suitable on-line equipment through a dedicated line. Each of the components is provided with a secondary controller for controlling the operation of the corresponding component on the basis of instructions given thereto by the process controller 101.

The operation of the resist film forming and developing system 1 will be described. The wafer carrying arm 21a of the wafer carrying mechanism 21 accesses the wafer cassette CR and takes out a wafer W from the wafer cassette CR. Then, the wafer carrying mechanism 21 carries the wafer W to the extension unit EXT of the third processing unit group $G_3$ of the processing station 11.

Then, the wafer carrying device 46 of the main wafer carrying mechanism 22 carries the wafer W to the alignment unit ALIM of the third processing unit group $G_3$. The wafer W aligned by the alignment unit ALIM is carried to the adhesion processing unit AD. The adhesion processing unit AD processes the wafer W by a hydrophobicity imparting process (HMDS process) to enhance the adhesion of a resist film to the wafer W. Then, the wafer carrying device 46 carries the wafer W to the cooling unit COL to cool the wafer W.

Subsequently, the wafer carrying device 46 carries the wafer W cooled at a predetermined temperature to the resist film forming unit COT. The resist film forming unit COT forms a resist film on a surface of the wafer W. Then, the wafer W coated with the resist film is subjected to a prebaking process by one of the hot plate units HP of the processing unit group $G_3$ or $G_4$. Then, the wafer W is cooled at a predetermined temperature by one of the cooling units COL.

The wafer W thus coated with the resist film is carried to and aligned by the alignment unit ALIM of the third processing unit group $G_3$. The aligned wafer W is carried through the extension unit EXT of the fourth processing unit group $G_4$ to the interface unit 12.

The edge exposure device 23 of the interface unit 12 process a peripheral part of 1 mm in width of the wafer W by an exposure process to remove unnecessary part of the resist film from the wafer W. Then, the exposure system 2 adjacent to the interface unit 12 processes the resist film by an exposure process to expose the resist film in a predetermined pattern.

The wafer W processed by the exposure process is returned to the interface unit 12, the wafer carrying mechanism 24 carries the wafer to the extension unit EXT of the fourth processing unit group $G_4$. Then, the wafer carrying device 46 carries the wafer W to one of the hot plate units HP. The hot plate unit HP processes the wafer W by a postexposure baking process. Subsequently, the wafer is cooled at a predetermined temperature by the cooling unit COL.

Then, the developing unit DEV processes the wafer W by a developing method embodying the present invention, which will be described later. The wafer W processed by the developing process is carried to and processed by a postbaking process by one of the hot plate units HP Then, the wafer W is cooled at a predetermined temperature by the cooling unit COL. After the wafer W has been processed by a series of those processes, the wafer W is returned through the extension unit EXT of the third processing unit group $G_3$ to the cassette station 10. Then, the wafer W is put into one of the wafer cassettes CR.

Figure 5:
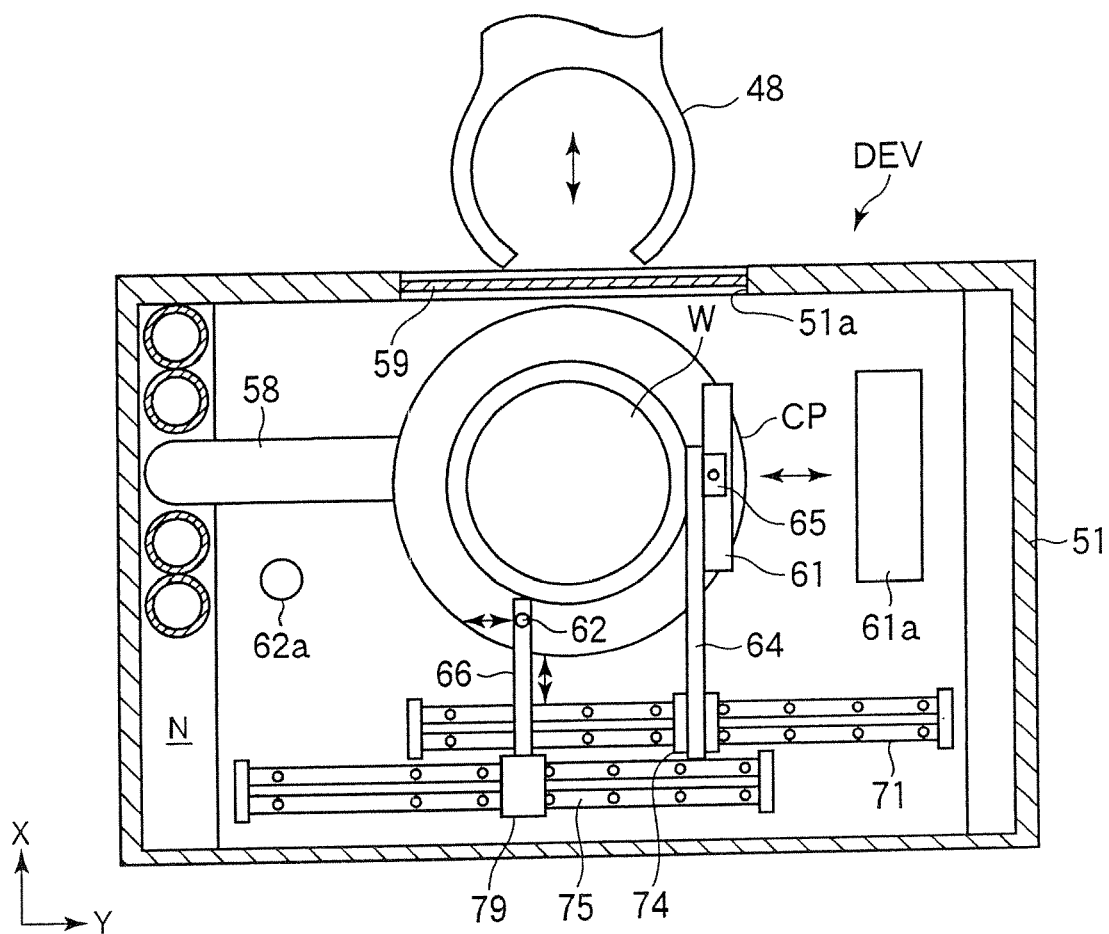
FIG. 5 is a plan view of a developing unit that carries out a method in a preferred embodiment according to the present invention.

The developing unit DEV for carrying out the developing method embodying the present invention will be described. FIGS. 4 and 5 are a sectional view and a plan view, respectively, of the developing unit DEV. In FIGS. 4 and 5, an X-direction and a Y-direction are perpendicular to each other in a horizontal plane and a Z-direction is vertical.

Referring to FIGS. 4 and 5, the developing unit DEV has a casing 51. A fan-filter unit is disposed on the top wall of the casing 51 to produce a down flow of clean air in the casing 51. An annular cup CP is disposed in a central part of the interior of the casing 51 and a spin chuck 52 is disposed inside the cup CP. The spin chuck 52 holds the wafer W fixedly thereon by suction. A drive motor 53 disposed below the spin chuck 52 drives the spin chuck 52 for rotation. The drive motor 53 is attached to a bottom plate 54.

A lifting pins 55 placed in the cup CP can be moved vertically by a driving mechanism 56, such as a pneumatic cylinder actuator, to receive and transfer the wafer W. A drain port 57 for draining waste liquids is formed in the cup CP A drain pipe 58 (FIG. 5) is connected to the drain port 57. The drain pipe 58 is extended through a space N extending between the bottom plate 54 and the casing 51 and is connected to a waste liquid discharge port, not shown, formed below.

An opening 51a is formed in a side wall of the casing 51. The holding member 48 of the wafer carrying device 46 of the main carrying mechanism 22 moves through the opening 51a into the casing 51. The opening 51a is covered by a shutter 59. The shutter 59 is opened to uncover the opening 51a. The shutter 59 is opened and the holding member 48 moves through the opening 51a into the casing 51 to carry the wafer W into and to carry out the wafer W from the casing 51. The lifting pins 55 are raised when the wafer W is transferred between the holding member 48 and the spin chuck 52.

A developer discharge nozzle 61 for discharging a developer onto the surface of the wafer W and a rinsing liquid discharge nozzle 62 for discharging a rinsing liquid, such as pure water, onto the wafer W are disposed above the cup CP. Each of the nozzles 61 and 62 can be moved between a working position above the wafer W and a home position outside a space extending over the wafer W.

The long developer discharge nozzle 61 is horizontally extended. The developer discharge nozzle 61 is provided in its lower wall with a plurality of discharge openings. A developer is discharged through the discharge openings falls generally in a band on the wafer W. The developer discharge nozzle 61 is detachably held by a holding member 65 on a free end part of a first nozzle moving arm 64. The first nozzle moving arm 64 is attached to an upper end part of a first vertical support member 72 extended vertically upward from a first guide rail 71. The developer discharge nozzle 61 is moved horizontally together with the first vertical support member 72 in the Y-directions by a Y-axis driving mechanism 73. The first vertical support member 72 can be vertically moved by a Z-axis driving mechanism 74 to move the developer discharge nozzle 61 between a lower discharge position near the wafer W and an upper retracted position apart from the wafer W. To wet the wafer W with the developer, the developer discharge nozzle 61 is positioned at the discharge position above the wafer W, the developer is discharged in a band and the wafer W is turned. The wafer W is turned through an angle of 180° or above to coat the surface of the wafer W entirely with a developer puddle. The developer discharge nozzle 61 may be moved along the guide rail 71 and the developer may be discharged through the developer discharge nozzle 61 while the wafer W is kept stationary.

The rinsing liquid discharge nozzle 62 is straight. The rinsing liquid discharge nozzle 62 is moved to a position above the wafer W after the wafer W has been processed by the developing process. The rinsing liquid discharge nozzle 62 discharges a rinsing liquid, such as pure water, onto a resist pattern formed on the wafer W by developing the resist film. The rinsing liquid discharge nozzle 62 is detachably held on a free end part of a second nozzle moving arm 66. The second nozzle moving arm 66 is attached to an X-axis driving mechanism 79 attached to an upper end part of a second vertical support member 76 extended vertically upward from a second guide rail 75. The second guide rail 75 is extended on the outer side of the first guide rail 71. The rinsing liquid discharge nozzle 62 is moved horizontally together with the second vertical support member 76 in the Y-directions by a Y-axis driving mechanism 77. The second vertical support member 76 can be vertically moved by a Z-axis driving mechanism 78 to move the rinsing liquid discharge nozzle 62 between the lower discharge position near the wafer W and the upper retracted position apart from the wafer W. The second nozzle moving arm 66 can be moved in the X-directions by the X-axis driving mechanism 79. There are not particular restrictions on the shape of the rinsing liquid discharge nozzle 62. The rinsing liquid discharge nozzle 62 may be a long nozzle provided in its lower wall with a plurality of discharge openings like the developer discharge nozzle 61 or may be a nozzle provided with a discharge slit.

A controller 90 controls the Y-axis driving mechanisms 73 and 77, the Z-axis driving mechanisms 74 and 78, the X-axis driving mechanism 79 and the drive motor 53.

Referring to FIG. 5, a developer discharge nozzle maintaining unit 61a is disposed at the home position of the developer discharge nozzle 61 on the right-hand side of the cup CP. The developer discharge nozzle maintaining unit 61a is provided with a cleaning mechanism, not shown, for cleaning the developer discharge nozzle 61. A rinsing liquid discharge nozzle maintaining unit 62a is disposed at the home position of the rinsing liquid discharge nozzle 62 on the left-hand side of the cup CP The rinsing liquid discharge nozzle maintaining unit 62a is provided with a cleaning mechanism, not shown, for cleaning the rinsing liquid discharge nozzle 62.

Figure 6:
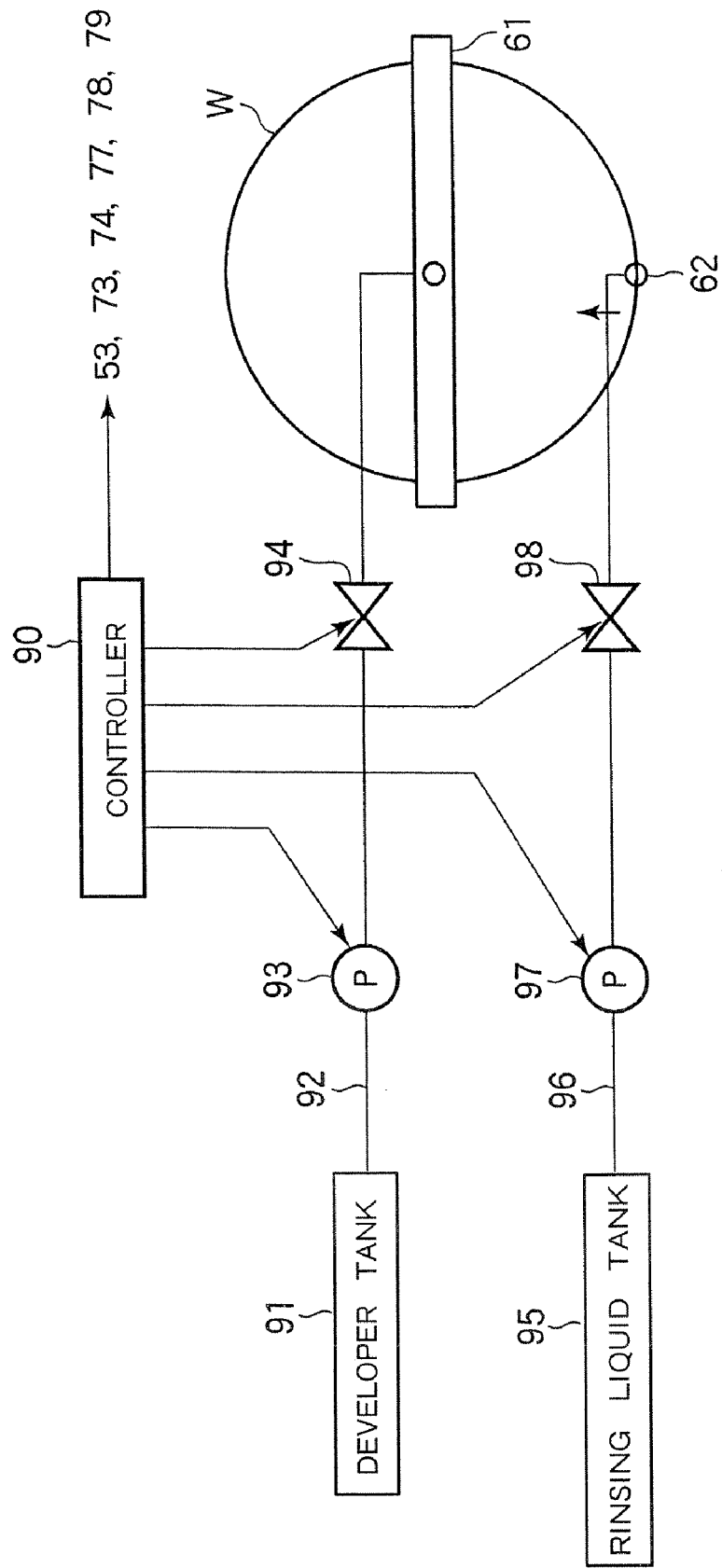
FIG. 6 is a diagrammatic view of a liquid supply system for the developing units shown in FIGS. 4 and 5.

FIG. 6 is a diagrammatic view of a liquid supply system for the developing unit DEV. As shown in FIG. 6, a developer supply line 92 is connected to the developer discharge nozzle 61 to supply the developer from a developer tank 91 containing the developer. The developer supply line is provided with a pump 93 for pumping the developer and a shutoff valve 94. A rinsing liquid supply line 96 is connected to the rinsing liquid discharge nozzle 92 to supply the rising liquid from a rinsing liquid tank (pure water tank) 95 containing the rinsing liquid (pure water). The rinsing liquid supply line is provided with a pump 97 for pumping pure water and a shutoff valve 98.

The pumps 93 and 97 and the shutoff valves 94 and 98, similarly to the Y-axis driving mechanisms 73 and 77, the Z-axis driving mechanisms 74 and 78, the X-axis driving mechanism 79 and the drive motor 53, are electrically connected to the controller 90 and are controlled by the controller 90. The controller 90 controls not only the driving mechanisms, the pumps and the valves and the developing units DEV, but also all other components according to instructions give thereto by the process controller 101.

A developing method including a rinsing method in a preferred embodiment according to the present invention will be described with reference to FIG. 7 showing a flow chart and FIG. 8 illustrating steps of the developing method.

In Step 1, the holding member 48 of the wafer carrying device 46 carries a wafer coated with a resist film exposed in a predetermined pattern and processed by the postexposure baking process and the cooling process to a position directly above the cup CP the lifting pins 55 receive the wafer W and transfers the wafer W to the spin chuck 52, and then the spin chuck 52 holds the wafer W by suction.

In Step 2, the developer discharge nozzle 61 is moved to the discharge position above the wafer W, the developer is discharged in the shape of a band onto the wafer W being turned. The wafer W is turned through an angle of 180° or above while the developer is being discharged onto the wafer W. For example, the wafer W is turned through an angle of 360° to coat the surface of the wafer W entirely with the developer such that a developer puddle 201 of a thickness of, for example, 2 mm is formed on the surface of the wafer W as shown in FIG. 8(*a*). The developer may be discharged while the developer discharge nozzle 61 is being moved along the guide rail 71.

The wafer W thus coated with the developer is kept stationary for a suitable time, such as 60 s, to make development progress in Step 3. Meanwhile, the second nozzle moving arm 66 is moved to locate the rinsing liquid discharge nozzle 62 at a position above a central part of the wafer W as shown in FIG. 8(*b*) in Step 4.

After the predetermined time has elapsed, the rinsing liquid discharge nozzle 62 is lowered to the discharge position above the central part of the wafer W and the rinsing liquid 202 is discharged onto the developer puddle 201 as shown in FIG. 8(*c*) in Step 5. The wafer W is stopped or is rotated at a low rotating speed of 500 rpm or below, preferably, 100 rpm or below when the rinsing liquid discharge nozzle 62 starts discharging the rinsing liquid. Preferably, the rinsing liquid is discharged at a discharge rate of 500 ml/min or below. If the wafer W is rotated at a high rotating speed or the rinsing liquid is discharged at a high discharge rate at the initial stage of a rinsing liquid discharge operation, it is difficult to control the spread of the rinsing liquid.

Then, in Step 6, the discharge of the rinsing liquid is stopped in a state where the developer puddle remains at least on a peripheral part of the wafer W. More specifically, as shown in FIG. 8(*d*), the discharge of the rinsing liquid is stopped before the rinsing liquid spreading from the central part of the wafer W toward the outer edge of the wafer W reaches the edge of the wafer W. Preferably, the distance between the center of the wafer W and the circumference of the rinsing liquid spread on the wafer W is in the range of 30 to 130 mm. Typically, the distance is 50 mm. Although a time necessary for spreading the rinsing liquid in such a condition is dependent on the rinsing liquid discharge rate and the rotating speed of the wafer W, a time between the start and the stop of discharging the rinsing liquid is several seconds. The state shown in FIG. 8(*d*) can be achieved by stopping the wafer W or by maintaining the low initial rotating speed of the wafer W when the discharge of the rinsing liquid onto the wafer W is stopped.

In Step 6, the wafer W is rotated so that the developer puddle may be shoved radially outward by the ringing liquid as shown in FIG. 8(*e*). The discharge of the rinsing liquid may be stopped before a boundary plane 203 between the developer and the rinsing liquid reaches the edge of the wafer W such that the developer puddle 201 remains at least on a peripheral part of the wafer W.

To create a state shown in FIG. 8(*e*) at time when the discharge of the rinsing liquid is stopped, it is preferable to increase the rotating speed of the wafer W for a very short time of, for example, on the order of 1 s immediately before stopping the discharge of the rinsing liquid. Preferably, the increased rotating speed in between 500 and 2000 rpm, for example, 1000 rpm. The boundary plane 203 between the rinsing liquid and the developer can be effectively expanded by thus increasing the rotating speed of the wafer W immediately before stopping the discharge of the rinsing liquid. The efficiency of replacement of the developer with the rinsing liquid in a central part of the wafer W can be improved and development defects can be reduced by expanding the developer puddle radially outward by such means when the discharge of the rinsing liquid is stopped. Preferably, the distance between the boundary plane 203 and the center of the wafer W is in the range of 30 to 130 mm, typically, 50 mm when the discharge of the rinsing liquid is stopped. In some cases, the rinsing liquid is forced to flow radially outward over the developer puddle 201 by centrifugal force when a state shown in FIG. 8(*e*) is created when the discharge of the rinsing liquid is stopped. The radially outward flow of the rinsing liquid over the developer puddle 201 is permissible if the developer puddle 201 remains at least in a peripheral part of the wafer W.

Subsequently, the wafer W is rotated at a high rotating speed to shake the developer remaining on the wafer W off the wafer W together with the rinsing liquid in Step 7. The high rotating speed is in the range of 100 to 5000 rpm, for example, 2000 rpm.

The rinsing liquid 202 shoves the developer puddle 201 radially outward when the rinsing liquid 202 is forced to spread radially outward by centrifugal force in Step 7. More concretely, the boundary plane 203 between the rinsing liquid 202 and the developer puddle 201 expands further radially outward through a state shown in FIG. 8(*e*) if the developer puddle 201 and the rinsing liquid are in a state shown in FIG. 8(*d*) when the discharge of the rinsing liquid is stopped or from the state shown in FIG. 8(*e*) if the developer puddle 201 and the rinsing liquid are in the state shown in FIG. 8(e) when the discharge of the rinsing liquid is stopped. Eventually, the rinsing liquid 202 expels the developer puddle 201 away from the wafer W. The resist film formed on the wafer W has high wettability to the developer and a peripheral part of the wafer W is coated with the developer puddle 201 during the radial expansion of the rinsing liquid. Therefore, the developer and the rinsing liquid can be shook off the wafer W without being separated from each other at the edge of the wafer W. Thus, the rinsing liquid, namely, pure water, rarely breaks, residue remaining after the developing process remaining on the wafer W can be more surely removed and development defects can be reduced even if the resist film formed on the surface of the wafer W is highly hydrophobic.

Figure 9:
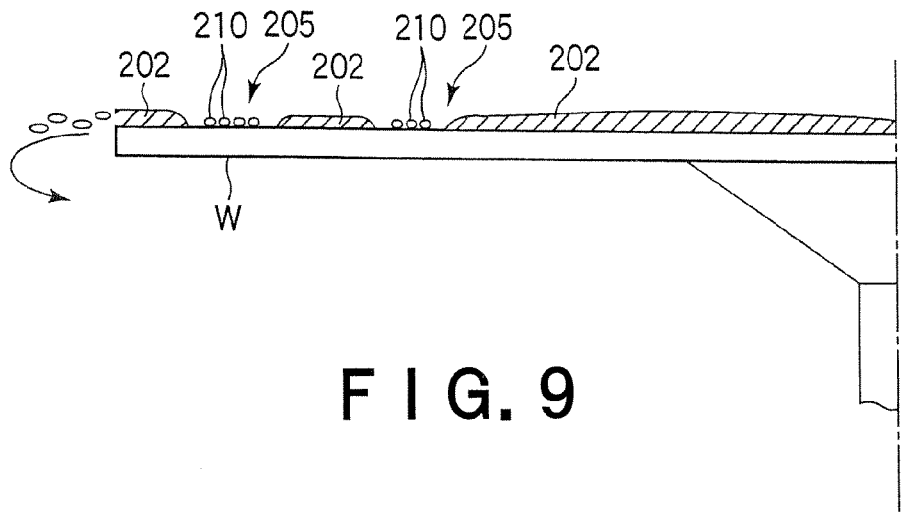
FIG. 9 is a typical view of wafer processed by a conventional rinsing recipe after being processed by a developing process.

A known developing method executes a recipe defining steps of forming a developer puddle on a wafer W by holding a developer on the wafer, keeping the wafer W stationary for development, discharging a rinsing liquid onto a central part of the wafer W for about 5 s while the wafer W is rotating at a rotating speed on the order of 2000 rpm, discharging the rinsing liquid onto the wafer W for about 10 s after dropping the rotating speed of the wafer W to about 500 rpm, and rotating the wafer W at a high rotating speed on the order of 4000 rpm to dry the wafer W by shaking the rinsing liquid remaining on the wafer W off the wafer W. When the wafer w is processed according to this recipe, only the rinsing liquid remains on the wafer when the wafer w is rotated at a high rotating speed to shake off the rinsing liquid. Consequently, if the resist film remaining on the wafer W is highly hydrophobic, the rinsing liquid, namely, pure water, cannot satisfactorily wet the resist film and hence it is possible that the film of the rinsing liquid breaks at the edge of the wafer W while the rinsing liquid is being expelled by centrifugal force. If the film of the rinsing liquid breaks, the rinsing liquid 202 cannot carry residues 210 remaining on the wafer after the developing process off the wafer W. Consequently, the residues 202 remain on parts of the surface of the wafer W corresponding to broken parts of the film of the rinsing liquid as shown in FIG. 9. Those residues 202 remaining on the wafer W can cause development defects after drying.

As mentioned above, the developing method in the preferred embodiment does not expel the developer by the rinsing liquid, shoves the developer by the rinsing liquid so that a developer puddle remains at least on a peripheral part of the wafer, and then shakes the developer and the rinsing liquid off the wafer. Therefore, the film of the rinsing liquid will not break and development defects can be reduced regardless of the property of the surface of the wafer.

The breakage of the film of the rinsing liquid (pure water) in a peripheral part of the wafer W is likely to occur when the resist film is highly hydrophobic. Therefore, the developing method in the preferred embodiment is effective in developing highly hydrophobic resist films, such as resist films which are processed by an exposure process using ArF laser light or KrF laser light, which have been widely noticed in recent years. More concretely, the developing method in the preferred embodiment is effective in developing resist films processed by an exposure process and having surfaces with which the rinsing liquid (pure water) comes into contact at a contact angle between 20° and 50°.

Figure 10:
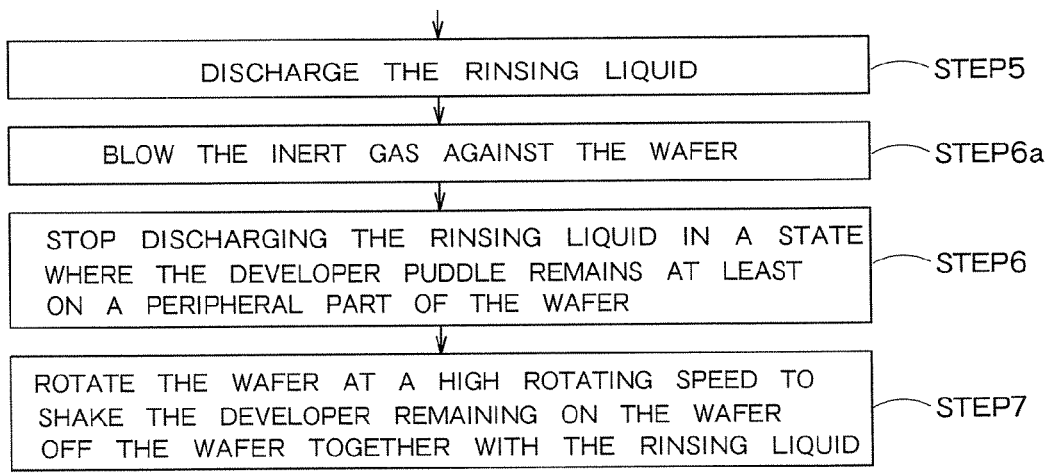
FIG. 10 is a flow chart of a rinsing method in a second embodiment according to the present invention.
Figure 11:
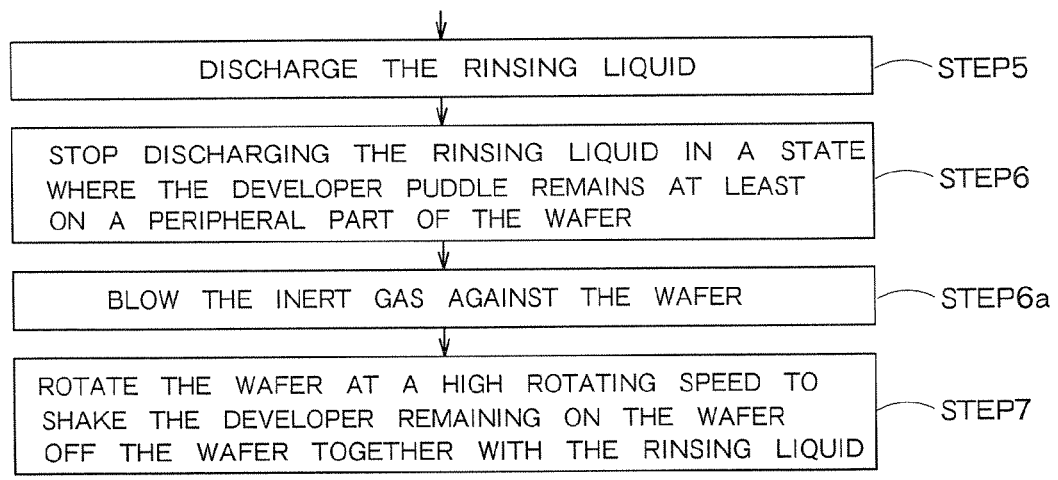
FIG. 11 is a flow chart of a rinsing method in a third embodiment according to the present invention.

Preferably, an inert gas, such as $N_2$, is blown against a central part of the wafer W in Step 6a preceding Step 6 in which the discharge of the rinsing liquid is stopped as shown in FIG. 10 to reduce development defects. As shown in FIG. 11, Step 6a for blowing an inert gas against a central part of a wafer may be executed between Step 6 in which the discharge of the rinsing liquid is stopped and Step 7 in which the developer is shaped off the wafer together with the rinsing liquid. Step 6a may be executed before the developer is shook off the wafer. The step of blowing an inert gas against the wafer is effective in creating the state shown in FIG. 8(e) by increasing the rotating speed of the wafer W immediately before the discharge of the rinsing liquid is stopped. Preferably, the blowing of the inert gas is timed as shown in FIG. 10 such that the inert gas is blown against a central part of the wafer W simultaneously with the discharge of the rinsing liquid.

Since a central part of the wafer W is difficult to dry, the rinsing liquid 202 containing residues 210 remaining after development remains on the central part of the wafer W as shown in FIG. 12(a) even though the boundary plate 203 between the rinsing liquid 202 and the developer puddle 201 expands radially outward. Those residues 210 remain on the wafer W after the surface wetted with the rinsing liquid has been dried up and cause development defects. The rinsing liquid 202 wetting the central part of the wafer W can be rapidly moved radially outward together with the residues 210 remaining on the wafer W after development as shown in FIG. 12(b) by blowing the inert gas against the central part of the wafer W and, consequently, development defects can be reduced. Time for which the inert gas is blown to reduce development defects may be a very short time of, for example, 0.5 s. The inert gas is not limited to $N_2$ and may be any other inert gas such as Ar gas.

A composite nozzle formed by combining a rinsing liquid discharge nozzle 62 and an inert gas blowing nozzle 63 as shown in FIG. 13 is used to blow the inert gas against a central part of the wafer W. In Step 5 for discharging the rinsing liquid, the rinsing liquid discharge nozzle 62 is located at a position corresponding to the center of the wafer W as shown in FIG. 13(a). In Step 6a for blowing the inert gas against the central part of the wafer W, the inert gas blowing nozzle 63 is located at a position corresponding to the center of the wafer W as shown in FIG. 13(b).

Experiments conducted to verify the effects of the present invention will be described.

A developer puddle was formed on 300 mm diameter wafers W each coated with a resist film exposed to ArF laser light. The wafers W were processed by rinsing processes specified by recipes 1, 2 and 3 shown in Tables 1, 2 and 3, respectively. The wafer W was processed according to the recipe 1 in an example of the present invention shown in Table 1. Pure water, namely, a rinsing liquid, was discharged onto the center of the wafer W at a discharge rate of 250 ml/min for 2 s while the wafer W was rotating at 100 rpm. Then, the rotating speed of the wafer W was increased at an acceleration of 3000 rpm/s up to 1000 rpm while the rinsing liquid was discharged continuously at the same discharge rate. The wafer W was rotated at 1000 rpm for 0.5 s. Then, $N_2$ was blown for 0.5 s against a central part of the wafer W while pure water, namely, the rinsing liquid, was discharged onto the wafer W. Subsequently, the discharge of the rinsing liquid and the blowing of $N_2$ were stopped, and then the rotating speed of the wafer W was increased to 2000 rpm to shake the rinsing liquid together with the developer off the wafer W. The recipe 2 in an example of the present invention shown in Table 2 is similar to the recipe 1, except that the recipe 2 does not have the step of blowing $N_2$ against the wafer W. When the wafers W were processed according to the recipes 1 and 2, the boundary plane between the rinsing liquid and the developer was at 130 mm from the center of the wafer W at the moment the discharge of the rinsing liquid is stopped. The recipe 3 shown in Table 3 is a comparative example not conforming to the present invention. The recipe 3 is produced by adding a step of rotating the wafer W at 1500 rpm for 8 s while the rinsing liquid is discharged continuously between the first step of rotating the wafer W at 100 rpm while the rinsing liquid is discharged on to the wafer W and the second step of increasing the rotating speed of the wafer W to 1000 rpm of the recipe 1. When the wafer W was processed according to the recipe 3, all the developer puddle formed on the wafer W was replaced with the rinsing liquid before the wafer W was dried by shaking off the rinsing liquid.

TABLE 1

Recipe 1 (Embodiment)

| Time (Sec) | Rotating Speed (rpm) | Nozzle |
|---|---|---|
| 2 | 100 | Rinse |
| 0.5 | 1000 | Rinse |
| 0.5 | 1000 | Rinse · $N_2$ |
| 15 | 2000 | Nothing |

TABLE 2

Recipe 2 (Embodiment)

| Time (Sec) | Rotating Speed (rpm) | Nozzle |
|---|---|---|
| 2 | 100 | Rinse |
| 0.5 | 1000 | Rinse |
| 0.5 | 1000 | Rinse |
| 15 | 2000 | Nothing |

TABLE 3

Recipe 3 (Comparison)

| Time (Sec) | Rotating Speed (rpm) | Nozzle |
|---|---|---|
| 2 | 100 | Rinse |
| 8 | 1500 | Rinse |
| 0.5 | 1000 | Rinse |
| 0.5 | 1000 | Rinse · $N_2$ |
| 15 | 2000 | Nothing |

Development defects found on the surfaces of the wafers W processed by rinsing processes according to the recipes 1 to 3 are shown in wafer maps shown in FIGS. 14(a), 14(b) and 14(c) and Table 4. In FIGS. 14(a), 14(b) and 14(c), one dot indicates one development defect. FIGS. 14(a), 14(b) and 14(c) show the surfaces of the wafers W processed by rinsing processes according to the recipes 1, 2 and 3, respectively. As obvious from FIGS. 14(a), 14(b) and 14(c) and Table 4, whereas only small numbers of development defects, twenty-four development defects and thirty-four development defects, were formed on the surfaces of the wafers W processed by the rinsing processes according to the recipes 1 and 2, respectively, a very large number of development defects, 8714 development defects, were formed on the surface of the wafer W processed by the rinsing process according to the recipe 3. The results of experiments proved the advantageous effects of the present invention. It is known from the comparison of the wafers W respectively processed by the rinsing processes according to the recipes 1 and 2 that the number of the development defects on the wafer W processed by the rinsing process according to the recipe 1 is less than that of the development defects on the wafer W processed by the rinsing process according to the recipe 2 owing to the effect of blowing $N_2$ against the wafer W.

Table 4

TABLE 4

| | Development Defect (Number) | Note |
|---|---|---|
| Recipe 1 | 24 | Embodiment |
| Recipe 2 | 86 | Embodiment |
| Recipe 3 | 8714 | Comparison |

The present invention is not limited in its practical application to the foregoing embodiment specifically described herein. For example, the rinsing liquid is not limited to pure water and may be a solution prepared by mixing other substance, such as a surface-active agent, and pure water. The present invention is applicable not only to a developing process subsequent top an ordinary exposure process, but also to a developing process subsequent to an immersion exposure process. Although the foregoing embodiment has been described as applied to the developing process for processing semiconductor wafers, the present invention is applicable to developing processes for processing substrates on which minute patterns are formed, such as substrates for liquid crystal displays (LCDs) and the like. The present invention includes developing methods designed by properly combining the foregoing embodiments and those developed by partly omitting the factors of the foregoing embodiments without departing from the scope of the present invention.

What is claimed is:

1. A rinsing method of rinsing a substrate processed by a developing process that forms a developer puddle on a resist film formed on the substrate and having an exposed pattern, said rinsing method comprising the steps of:
    discharging a rinsing liquid onto a central part of the substrate processed by the developing process and coated with the developer puddle while the substrate is stopped or rotated;
    stopping discharging the rinsing liquid in a state where the developer puddle remains at least in a peripheral part of the substrate; and
    rotating the substrate at a high rotating speed to shake the developer remaining on the substrate off the substrate together with the rinsing liquid,
    wherein the discharge of the rinsing liquid is stopped before the rinsing liquid spreading from the central part of the substrate reaches an edge of the substrate and the discharge of the rinsing liquid is stopped in the state where the developer puddle remains so as to form a closed loop inside of the peripheral part of the substrate.

2. The rinsing method according to claim 1, wherein the discharge of the rinsing liquid is stopped upon the spread of the rinsing liquid in a circular area of a radius between 30 and 130 mm about the center of the substrate.

3. The rinsing method according to claim 2, wherein the discharge of the rinsing liquid is stopped upon the spread of the rinsing liquid in a circular area of a radius of 50 mm about the center of the substrate.

4. The rinsing method according to claim 1, wherein the rinsing liquid is discharged onto the substrate while the substrate is rotating, the rinsing liquid shoves the developer puddle radially outward and the discharge of the rinsing liquid is stopped before a boundary between the rinsing liquid and the developer reaches the outer edge of the substrate.

5. The rinsing method according to claim 4, wherein the substrate is rotated at a rotating speed between 500 and 2000 rpm for a short time immediately before the discharge of the rinsing liquid is stopped.

6. The rinsing method according to claim 4, wherein the discharge of the rinsing liquid is stopped upon the expansion of a boundary plane between the rinsing liquid and the developer puddle in a circle of a radius between 30 and 130 mm about the center of the substrate.

7. The rinsing method according to claim 6, wherein the discharge of the rinsing liquid is stopped upon the expansion of the boundary plane between the rinsing liquid and the developer pulled in a circle of a radius of 50 mm about the center of the substrate.

8. The rinsing method according to claim 1, the rinsing liquid is discharged at a discharging rate of 500 ml/minor below.

9. The rinsing method according to claim 1, wherein the substrate is rotated at a rotating speed of 500 rpm or below at an initial stage of the discharge of the rinsing liquid.

10. The rinsing method according to claim 9, wherein the substrate is rotated at a rotating speed of 100 rpm or below at an initial stage of the discharge of the rinsing liquid.

11. The rinsing method according to claim 1, wherein the rotating speed of the substrate is increased immediately before stopping the discharge of the rinsing liquid.

12. The rinsing method according to claim 1, wherein an inert gas is blown against a central part of the substrate immediately before stopping the discharge of the rinsing liquid.

13. The rinsing method according to claim 1, wherein an inert gas is blown against a central part of the substrate immediately before shaking the developer off the substrate together with the rinsing liquid.

14. The rinsing method according to claim 1, wherein the substrate is rotated at a rotating speed of 1000 rpm or above in the step of shaking the developer off the substrate together with the rinsing liquid.

15. The rinsing method according to claim 1, wherein contact angle between the surface of the wafer processed by the developing process and the rinsing liquid is between 20° and 50°.

16. A computer-read non-transitory storage medium storing a control program to be executed by a computer;
   wherein the computer executes the control program to control a developing system for carrying out the rinsing method according to claim 1.

* * * * *